United States Patent
Baone et al.

(10) Patent No.: US 10,809,683 B2
(45) Date of Patent: Oct. 20, 2020

(54) POWER SYSTEM MODEL PARAMETER CONDITIONING TOOL

(71) Applicant: General Electric Company, Schenectady, NY (US)

(72) Inventors: Chaitanya Ashok Baone, Glenville, NY (US); Nan Duan, Knoxville, TN (US); Anup Menon, Guilderland, NY (US); Mustafa Tekin Dokucu, Latham, NY (US)

(73) Assignee: General Electric Company, Schenectady, NY (US)

( * ) Notice: Subject to any disclaimer, the term of this patent is extended or adjusted under 35 U.S.C. 154(b) by 377 days.

(21) Appl. No.: 15/794,769

(22) Filed: Oct. 26, 2017

(65) Prior Publication Data

US 2019/0129367 A1  May 2, 2019

(51) Int. Cl.
 *G06F 30/20* (2020.01)
 *G05B 17/02* (2006.01)
 (Continued)

(52) U.S. Cl.
 CPC .............. *G05B 17/02* (2013.01); *G06F 30/20* (2020.01); *G06F 30/367* (2020.01);
 (Continued)

(58) Field of Classification Search
 None
 See application file for complete search history.

(56) References Cited

U.S. PATENT DOCUMENTS

| 7,415,389 B2 | 8/2008 | Stewart et al. |
| 7,869,928 B2* | 1/2011 | Hoff ................... G05B 23/0254 701/100 |

(Continued)

FOREIGN PATENT DOCUMENTS

| CN | 103473401 A | 12/2013 |
| KR | 20170028121 A | 3/2017 |
| WO | 2007/070255 A2 | 6/2007 |

OTHER PUBLICATIONS

Z. Huang, P. Du, D. Kosterev, and S. Yang, "Generator Dynamic Model Valdiation and parameter Calibration Using Phasor Measurements at the Point of Connection" IEEE 2013, pp. 1939-1949. (Year: 2013).*

(Continued)

*Primary Examiner* — Kibrom K Gebresilassie
(74) *Attorney, Agent, or Firm* — Buckley, Maschoff & Talwalkar LLC (57) ABSTRACT

A power system model parameter conditioning tool including a server control processor in communication with phasor measurement unit monitored data records of multiple disturbance events, a model calibration unit providing event screening, power system model simulation, and simultaneous tuning of model parameters. The model calibration performing a simulation using default model parameters, the processor comparing the simulation results to the monitored data. If the prediction is within threshold, then terminating conditioning; else performing parameter identifiability analysis to determine differing effects of various model parameters on power system model accuracy, selecting a parameter set causing a degradation in power system model prediction, and updating the default model parameters corresponding to members of the parameter set with values (Continued)

selected to reduce the degradation. A method and a non-transitory computer readable medium are also disclosed.

17 Claims, 5 Drawing Sheets

(51) Int. Cl.
  *H02J 13/00* (2006.01)
  *G06F 30/367* (2020.01)
  *H02J 3/24* (2006.01)
(52) U.S. Cl.
  CPC ............ *H02J 13/0006* (2013.01); *H02J 3/24* (2013.01); *H02J 13/00002* (2020.01); *H02J 13/00018* (2020.01); *H02J 13/0062* (2013.01); *H02J 13/0075* (2013.01); *H02J 13/0079* (2013.01); *H02J 2203/20* (2020.01)

(56) References Cited

U.S. PATENT DOCUMENTS

| | | | |
|---|---|---|---|
| 9,846,752 B2* | 12/2017 | Nasle | G06F 17/5009 |
| 10,393,793 B1* | 8/2019 | Nguyen | G01R 31/088 |
| 2005/0012396 A1* | 1/2005 | Chidambaram | H02J 13/001 |
| | | | 307/77 |
| 2005/0033481 A1 | 2/2005 | Budhraja et al. | |
| 2005/0137834 A1 | 6/2005 | Heydt et al. | |
| 2007/0055392 A1* | 3/2007 | D'Amato | G05B 13/048 |
| | | | 700/44 |
| 2008/0109205 A1* | 5/2008 | Nasle | G06F 17/5009 |
| | | | 703/18 |
| 2012/0290104 A1* | 11/2012 | Holt | G06Q 10/00 |
| | | | 700/29 |
| 2013/0091258 A1 | 4/2013 | Shaffer et al. | |
| 2013/0218494 A1* | 8/2013 | Chiang | H02J 3/06 |
| | | | 702/61 |
| 2014/0001847 A1* | 1/2014 | Khandelwal | H02J 3/14 |
| | | | 307/11 |
| 2014/0172125 A1 | 6/2014 | Shokooh et al. | |
| 2014/0229127 A1 | 8/2014 | Jinfeng et al. | |
| 2015/0100282 A1 | 4/2015 | Shokooh et al. | |
| 2015/0149128 A1* | 5/2015 | Baone | G06F 30/20 |
| | | | 703/2 |
| 2015/0235150 A1* | 8/2015 | Schmitt | F01K 23/101 |
| | | | 705/348 |
| 2016/0154041 A1 | 6/2016 | Bi et al. | |
| 2016/0246904 A1 | 8/2016 | Meagher et al. | |
| 2018/0278055 A1* | 9/2018 | Shaik | G05B 23/0283 |
| 2019/0129367 A1* | 5/2019 | Baone | G05B 17/02 |

OTHER PUBLICATIONS

Z. Huang, P. Du, D. Kosterev, and S. Yang, "Generator Dynamic Model Validation and parameter Calibration Using Phasor Measurements at the Point of Connection" IEEE 2013, pp. 1939-1949 (Year: 2013).*
Extended European Search Report for European Application No. 18190467.3 dated Mar. 13, 2019, 7 pp.
Parrilla, Zharadeen et al., "A Computer-Based System for Validation of Thermal Models for Multichip Power Modules", Proceedings of IEEE Workshop on Computers in Power Electronics, http://ieeexplore.ieee.org/document/1196713/, Jun. 3-4, 2002, (pp. 42-46, 5 total pages).
Van Griensven, A. et al., "A Global Sensitivity Analysis Tool for the Parameters of Multi-variable Catchment Models", Journal of hydrology, vol. 324, No. 1, Jun. 2006, DOI: 10.1016/j.jhydrol.2005.09. 008, (pp. 10-23, 10 total pages).
Tsai, Chin-Chu "PMU-Based Parameter Identification for the Synchronous Generator Dynamic Model", PhD Dissertation, The University of Texas, Arlington, Dec. 2011, 114pgs.
Huang, Zhenyu et al., "Generator Dynamic Model Validation and Parameter Calibration Using Phasor Measurements at the Point of Connection," IEEE Trans. Power Systems, vol. 28, No. 2, May 2013, DOI: 10.1109/TPWRS.2013.2251482, (pp. 1939-1949, 11 total pages).
Pourbeik, Pouyan et al., "Semiautomated Model Validation of Power Plant Equipment Using Online Measurements", IEEE Transactions on Energy Conversion, Jun. 2013, DOI: 10.1109/TEC.2013. 2242074, (pp. 1-9, 9 total pages).
Scacchioli, Annalisa et al., "Model-Based Diagnosis of an Automotive Electric Power Generation and Storage System", IEEE Transactions on Systems, Man, and Cybernetics: Systems, http://ieeexplore.ieee.org/document/6423955/, vol. 44, Issue 1, Jan. 2014, DOI: 10.1109/TSMCC.2012.2235951, (pp. 72-85, 14 total pages).
Gotseff, Peter et al., "Data-Driven Residential Load Modelling and Validation in Grid LAB-D", Ninth Annual IEEE Green Technologies Conference (GreenTech), http://ieeexplore.ieee.org/document/7923933/, Mar. 2017, DOI: 10.1109/GreenTech.2017.9, (pp. 20-25, 6 total pages).
Zhang, Kaiqing et al., "Dependency Analysis and Improved Parameter Estimation for Dynamic Composite Load Modeling", IEEE Transactions on Power Systems, vol. 32, Issue 4, Jul. 2017, DOI: 10.1109/TPWRS.2016.2623629, (pp. 3287-3297, 11 total pages).
Tsai, Chin-Chu et aL, "PMU Based Generator Parameter Identification to Improve the System Planning and Operation", IEEE PES General Meeting, San Diego, CA, 2012, 8pgs.
Li, Yuanyuan et al., "An Innovative Software Tool Suite for Power Plant Model Validation and Parameter Calibration using PMU Measurements", IEEE PES General Meeting, Chicago, IL, USA, Jul. 17-20, 2017, 5pgs.

* cited by examiner

POWER SYSTEM MODEL PARAMETER CONDITIONING TOOL

GOVERNMENT SUPPORT

Made using government support provided by the U.S. Department of Energy under Contract No. DE-OE0000858.

BACKGROUND

Power system models are useful in providing critical analysis of power system stability. One conventional approach to the validation and/or calibration of a power system model is to disconnect the power system component of interest from the electric distribution grid for a temporary period. Disconnection of a power system component such as a power plant reduces the ability of the electrical distribution grid to provide sufficient power to meet demand in the most cost effective manner.

Another conventional approach to validate and/or calibrate a power system model is to install one or more phasor measurement units (PMUs) into the electrical distribution grid at remote measurement points. The PMUs can measure characteristics of the electrical wave(s) present on the grid at these remote points. The captured measurements can be used to validate and/or calibrate the power system component model, without disconnecting the component from the grid. However under this conventional approach, the model calibration results are only valid for a specific disturbance. There is no guarantee that for a subsequent disturbance the parameter values tuned using a previous disturbance are still valid. Moreover, the parameter identifiability studies are conducted around the default parameter values. A highly localized identifiability study can affect the performance of the validation/calibration algorithm used to tune the component of interest.

What is missing from the art is a validation/calibration algorithm to tune power system models, which leverages actual PMU measurement data to improve the model for multiple possible disturbances without the need to disconnect the power system component itself from the electrical distribution grid to perform the model calibration.

DETAILED DESCRIPTION

Embodying systems and methods provide a power system model parameter conditioning tool for disturbance-based model validation and or calibration. This conditioning tool can improve the accuracy of a power system model for various types of dynamic devices used as power generation systems (i.e. generation plants, renewable energy sources, control devices, dynamic loads, etc.). In accordance with embodiments, high-fidelity disturbance measurement data obtained from PMUs for multiple disturbances can be leveraged to improve the power system model so that mandated grid reliability requirements can be met.

In accordance with embodiments, a parameter conditioning tool performs analysis using PMU data from multiple disturbances. This conditioning analysis can identify the magnitude and dependency of device parameter sensitivities in a power system model. From the analysis, a set of power system model parameters impacted by one selected disturbance, or more, is passed to a model calibration algorithm. The set of parameters can include those model parameters that are most impacted by the particular selected disturbance(s) (i.e., causing the greatest degradation in power system model prediction performance). In accordance with embodiments, a parametric sensitivity study can be conducted for differing types of disturbance to identify which parameters should be included in the set.

An embodying model calibration algorithm tunes these passed parameters of the power system model to make the outputs generated by the model more closely match the signals collected by the PMUs for the selected disturbances. In some implementations the generated outputs can be, for example, real and reactive power outputs. In accordance with embodiments, the parameter tuning considers the effect of multiple disturbances to arrive at a global model validation/calibration to best fit a variety of disturbances. In accordance with embodiments, a calibration step can tune parameters for multiple disturbances simultaneously.

Embodying approaches can account for non-linearity in the power system model; account for multiple differing disturbance events; calibration results can be localized around assumed default parameter values. Physical constraints of parameters are enforced during model calibration, and an embodying calibration algorithm avoids tuning model parameters that might already be set at their true (e.g., optimal) values.

Figure 1:
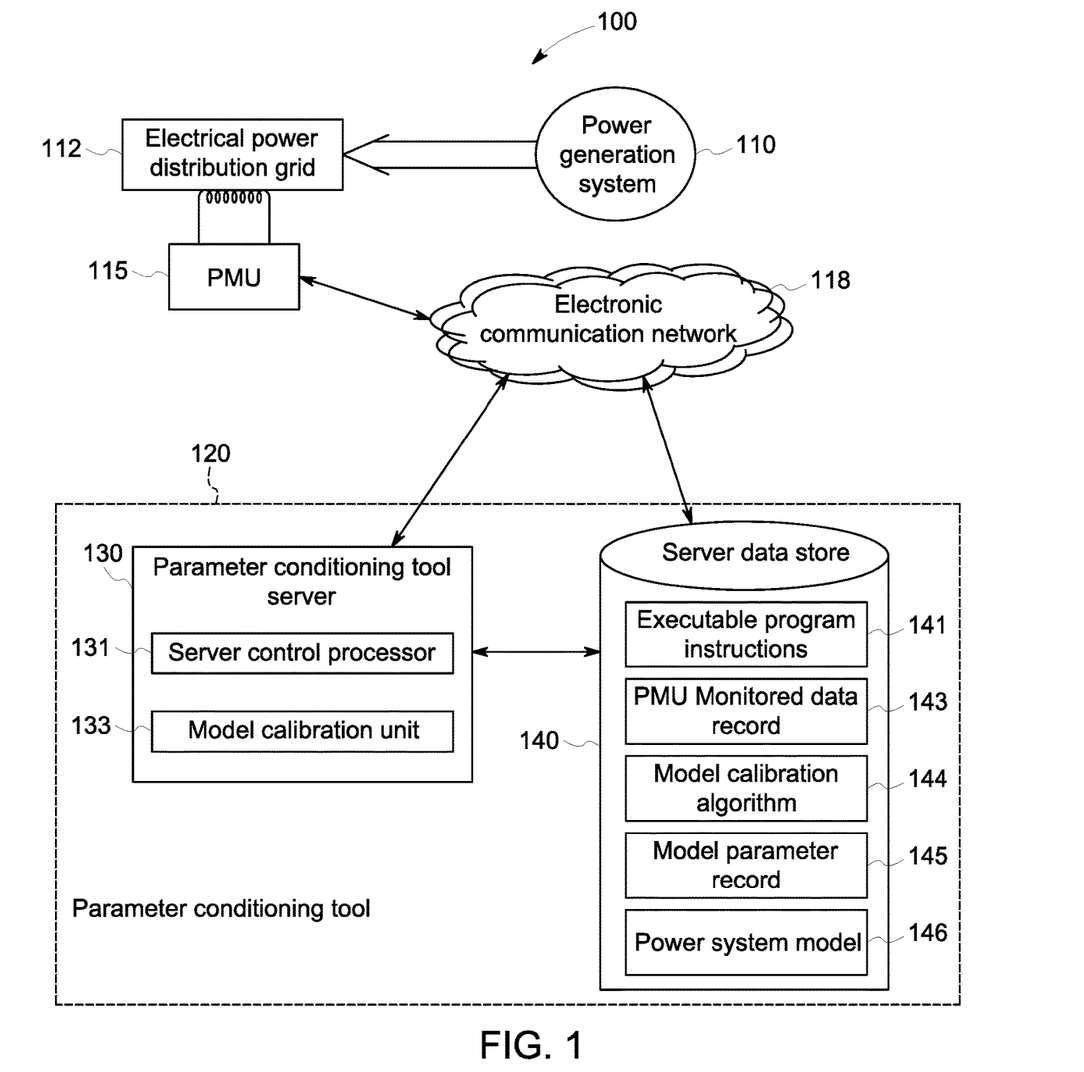
FIG. 1 depicts a system that includes a power system model parameter conditioning tool in accordance with embodiments.

FIG. 1 depicts system 100 that includes power system model parameter conditioning tool 110 in accordance with embodiments. An embodying parameter conditioning tool 120 can include server 130 in communication with data store 140.

Server 130 can include control processor 131 that communicates with other components of the parameter conditioning tool. Control processor 131 accesses computer executable instructions 141, which in some implementations can be stored in data store 140. The server control processor 131 can support embodying power system model parameter conditioning for disturbance-based model validation and or calibration by executing executable instructions 141. Dedicated hardware, software modules, and/or firmware can implement embodying approaches disclosed herein.

Server 130 van be in communication with data store 140 directly and/or across electronic communication network 118. The electronic communication network can be, can comprise, or can be part of, a private internet protocol (IP) network, the Internet, an integrated services digital network (ISDN), frame relay connections, a modem connected to a phone line, a public switched telephone network (PSTN), a public or private data network, a local area network (LAN), a metropolitan area network (MAN), a wide area network (WAN), a wireline or wireless network, a local, regional, or global communication network, an enterprise intranet, any combination of the preceding, and/or any other suitable communication means. It should be recognized that techniques and systems disclosed herein are not limited by the nature of network 118.

A power system can include power generation system 110, which provides electrical power to electrical power distribution grid 112. PMU 115 can be coupled to the electrical power distribution grid to monitor signal characteristics (e.g., voltage (V), frequency (F), active reactive power (P), and nonactive reactive power (Q)). Data obtained by PMU 115 can be provided to parameter conditioning tool 120 across electronic communication network 118. This data can be stored in data records PMU monitored data 143. It should be readily understood that a power system is not limited to a single power generation system; that an electrical power grid can be a vast, interconnected network of multiple producers (power generation systems), transmission lines, substations, transformers, and loads (power consumers); and that multiple PMUs can be coupled to the power grid at a multiple locations.

Under conventional approaches, a power system model is tuned ("calibrated") for one event (e.g., treating each disturbance event separately). This conventional approach results in severely limiting that model's performance to satisfactorily predict a power system's performance in response to a subsequent event. Because embodying approaches simultaneously perform power system parameter tuning across multiple events, these system parameters can be provided to a power system model. By incorporating the tuned parameters into the power system model, the model can more accurately predict power system performance than conventionally-calibrated ("tuned") models.

In accordance with embodiments, the parameter conditioning tool generates trajectory sensitivity matrices for all the selected disturbances. These matrices are generated by perturbing each model parameter and feeding the perturbed parameter values to model calibration unit 133. Depending on the number of disturbances being considered, model calibration algorithm 144 can follow two options.

If the number of disturbances is large enough that the union of null spaces of the sensitivity matrices of all the disturbances has a rank higher than the parameter number, an embodying model calibration algorithm can solve an optimization problem to find a solution that has the minimum total distance to all the null spaces. The solution reflects the parameter set that has dependencies in one or more of these disturbances. Therefore, such a solution gives a comprehensive identifiability ranking of parameters across disturbances.

If the number of disturbances is small, a second option can be implemented by model calibration algorithm 144. This second option evaluates the identifiability of parameters for each disturbance, then calculates the average identifiability ranking across disturbances. Since the sensitivity studies are conducted at the parameters' default values, the parameter conditioning tool can also perform a global sensitivity consistency study when the parameters' values deviate far away from their default values. Such study can portray the geometry of the parameter sensitivity in the entire parameter space.

Since different events may have different characteristics, the conventional identifiability analysis corresponding to each single event may not be applicable to other events. For example, a set of most-identifiable parameters for event A may not be identifiable for event B. Then, for a single event calibration, the value of this set of parameters is only tuned by a conventional approach to make the output match event A's measurement data. But when the tuned parameter values are used to simulate event B, there could still be discrepancy between simulation output from the power system model and measurement data from PMUs.

In accordance with embodiments, because there is availability of measurement data from multiple events, a comprehensive identifiability study across multiple events can be performed. This comprehensive study can provide a most-identifiable parameter set for the simultaneous calibration of multiple disturbances. In accordance with embodiments, this parameter set can be used to tune power system model 146 to better match (when compared to conventionally-tuned power system models) the measurement data of multiple events simultaneously.

When a quantity of N events is considered, applying singular-value decomposition (SVD) analysis to the sensitivity trajectory matrices results in a quantity of null spaces equal to the value of N. The null space for one event also can be interpreted as a system of homogeneous algebraic equations with parameter sensitivities being the unknowns. Since the null space from one event has a rank lower than the number of parameters, the number of equations is less than the number of unknowns.

Considering more events is equivalent to adding more equations to the system. After the event number N exceeds a certain value (also the characteristic of events should be diverse), the system would have more equations than unknowns. In implementation, the numerical rank should be greater than the number of unknowns. The solution that minimizes the difference between the left and right hand of the equation system represents the comprehensive sensitivity magnitude of all parameters across all the considered events. For sensitivity dependency, accounting for the null spaces of all considered events, a comprehensive dependency index can also be calculated.

In accordance with embodiments, if the number of events is not large enough to construct a null space with higher rank than the number of parameters, the identifiability for each single event is analyzed, and then the average identifiability can be uses as the identifiability across all events.

In accordance with embodiments, model calibration algorithm 144 can implement Algorithm I to perform a sensitivity dependency calculation using null space of the trajectory sensitivity matrix to calculate sensitivity dependency. The dependency index can be defined by counting the large elements in the right singular vectors in null space.

---

ALGORITHM I procedure DEPENDENCY (NullSpace)
    M ← number of parameters
    N ← number of right singular vectors in null space
        for j ← 1, M do
            $D_j$ ← 0
        end for
        for i ← 1, N do(Search for direct dependencies)
            for j ← 1, M do
                for k ← 1, M do
                    if NullSpace(k, i) ≥ threshold then
                        $D_j$ ← $D_j$ ∪ k
                  end if
                end for
            end for
        end for
        for j ← 1, M do
            L(j) ← | $D_j$ |
        end for
        k ← 1
        for j ← 1, M do (Search for indirect dependencies)
            while k ≤ L(j) do -continued

```
ALGORITHM I

D_indirect ← D_j \ D_Dj(k)
        if D_indirect ≠ 0 then
            D_j ← D_j ∪ D_indirect
            L(j) ← L(j) + | D_indirect |
        end if
        k ← k + 1
    end while
  end for
end procedure
```

Figure 2:
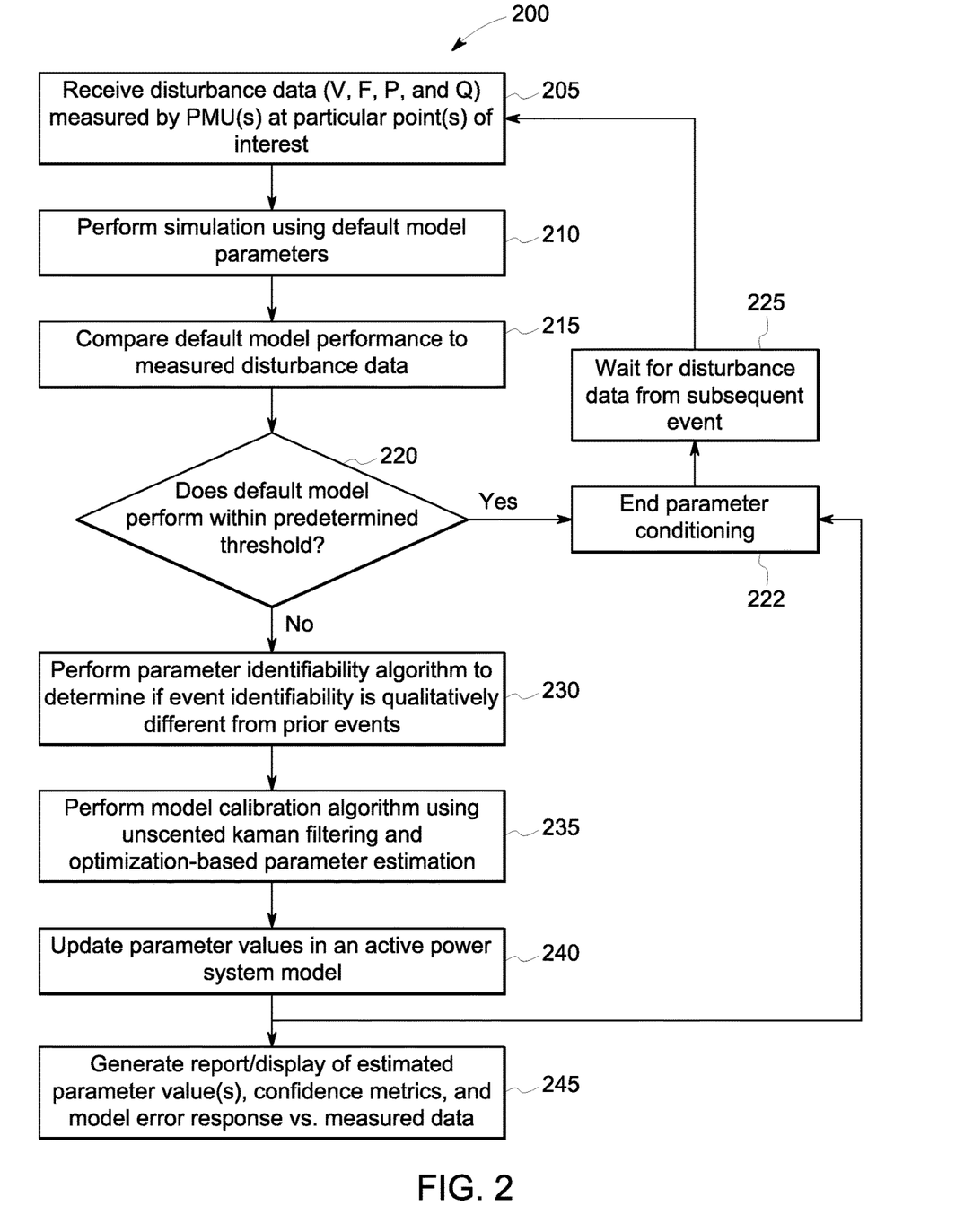
FIG. 2 depicts a process for power system model parameter conditioning in accordance with embodiments.

FIG. 2 depicts process 200 for power system model parameter conditioning in accordance with embodiments. Disturbance data monitored by one or more PMUs 115 coupled to electrical power distribution grid 112 is received, step 205. The disturbance data can include voltage, frequency, active and nonactive reactive power measurements from one or more points of interest on the electrical power grid. This data can be stored in PMU monitored data 143.

A playback simulation using default model parameters can be performed, step 210. These default parameters can be the current parameters incorporated in the power system model. The current parameters can be stored in model parameter record 145. The simulation can be done by model calibration unit 133, which can use a power system simulation engine such as GE PSLF, Powertech TSAT to perform a real-time power system simulation scenario.

In accordance with embodiments, the model calibration unit can implement model calibration with three functionalities. The first functionality is an event screening tool to select characteristics of disturbance event from a library of recorded event data. This functionality can simulate the power system responses when the power system is subjected to different disturbances. The second functionality is a preconditioning tool for the parameter identifiability study. When implementing this functionality, model calibration unit 133 can simulate the response(s) of a power system model. The third functionality is a tool for simultaneous tuning of models using an augmented event comprised of multiple events.

In accordance with embodiments, event screening can be implemented during the simulation to provide computational efficiency. If hundreds of events are stitched together and fed into the calibration algorithm unselectively, the algorithm may not be able to converge. To maintain the number of events manageable and still keep an acceptable representation of all the events, a screening procedure needs to be performed to select the most characteristic events among all. Depending on the type of events, the measurement data could have different characteristics. For example, if an event is a local oscillation, the oscillation frequency in the measurement data would be much faster than an inter-area oscillation event. In some implementations, a K-medoids clustering algorithm can be utilized to group events with similar characteristic together, thus reducing the number of events to be calibrated.

The results of the simulated default model performance can be compared, step 215, to actual disturbance data measured on the power system. If the default model performance is within (e.g., equal to or less than) a predetermined threshold of accuracy (e.g., specified by, for example, power system operators/designers, etc.), Process 200 can end parameter conditioning (step 222), and wait for disturbance data from a subsequent event (step 225).

If the default model performance is outside of the predetermined threshold, a parameter identifiability algorithm is performed, step 230. In accordance with embodiments, the parameter identifiability analysis can determine the differing effects that various parameters can have on power system model 146. In some implementations, each parameter can represent a factor/coefficient in a term of a polynomial expression representing the power system model. To decide which parameters of the power system model are the best choice to tune, a parameter sensitivity study is usually performed before model calibration. The sensitivity study can vary the value of the parameter, compare the power system model result to monitored data, and then determine the perturbation's magnitude caused by the variation in parameter value.

To calculate the model's sensitivity to each parameter, playback simulation is conducted with the value of that parameter perturbed upward and downward. The difference in the model's performance (i.e., when compared to the measured disturbance data) between the up, and the down perturbation yields the trajectory sensitivity matrix.

In accordance with embodiments, the parameter identifiability analysis addresses two aspects: (a) magnitude of sensitivity of output to parameter change; and (b) dependencies among different parameter sensitivities. For example, if the sensitivity magnitude of a particular parameter is low, the parameter would appear in a row being close to zero in the parameter estimation problem's Jacobian matrix. Also, if some of the parameter sensitivities have dependencies, it reflects that there is a linear dependence among the corresponding rows of the Jacobian. Both these scenarios lead to singularity of the Jacobian matrix, making the estimation problem infeasible. Therefore it is critical to down select parameters which are highly sensitive as well as result in no dependencies among parameter sensitivities.

In accordance with embodiments, the identifiability analysis can consider one disturbance event at a time as well as consider multiple disturbance events simultaneously. For a single event, the trajectory sensitivity matrix contains the information of the magnitude and dependency of parameter sensitivity. Singular value decomposition (SVD) is a useful tool for extracting such information. Let A be the Nt-by-Np trajectory sensitivity matrix, where Nt is the number of time samples, Np is the number of parameters. The SVD of A is, $$A = USV^T \quad \text{(EQ. 1)}$$

where the Nt-by-Nt matrix U's columns are the left singular vectors $u_i$'s (i=1 ... Nt) of A; the Nt-by-Np matrix S's upperleft diagonal elements are the singular values $\sigma i$'s (i=1 ... Np) of A; and the Np-by-Np matrix V's columns are the right singular vectors vi's (i=1 ... Np) of A.

After applying SVD to the trajectory sensitivity matrix A, the magnitude of the parameter sensitivities can be calculated as $$M_{sen} = \Sigma_{i=1}^{Np} \sigma_i^2 v_i^2 \quad \text{(EQ. 2)}$$

The dependency of parameter sensitivities can also be calculated from the result of SVD. The dependency of parameter sensitivities is contained in the right singular vectors corresponding to zero singular values (i.e., null space). For each column of the null space, if there are more than one element larger than a predefined threshold, the parameter sensitivities corresponding to those elements have dependency. This dependency can be explained by the definition of null space. Every right singular vector in the null space represents a zero-mode, the value of elements in that right singular vector indicate the contribution of parameter sensitivities to that zero mode. If there are multiple large elements, they contribute to the zero mode by offsetting each other.

Most algorithmic approaches to model calibration rely, one way or another, on the sensitivity of the system response to the parameter. If independent perturbations to a set of parameters have low or dependent response, a conventional algorithmic model calibration approach can fail to identify such a parameter set uniquely. Furthermore, having such a subset of parameters in the estimation set typically leads to numerical issues in calibration algorithms. Because the number of function evaluations (simulation runs) is proportional to the number of parameters being estimated, inclusion of such "unidentifiable" parameters leads to unnecessary increase in computation time in conventional approaches. In accordance with embodiments, such dependencies are identified and isolated before entering the calibration stage of the embodying model calibration algorithm. This identification and isolation implemented by disclosed embodiments is an improvement over conventional approaches, and is the rationale for the disclosed two-stage approach: identifiability analysis followed by model calibration.

Returning to Process 200, after the parameter identifiability at step 230, model calibration is performed (step 235). The model calibration can use unscented Kalman filter (UKF) to capture nonlinearity in the system, and implement optimization-based parameter estimation. In the UKF the parameter identification problem is posed as an estimation problem, where the uncertain states to be estimated are the parameters of the system. The observation model of the model-based estimation scheme includes the power system model and the tracked outputs. For optimization based estimation the parameter identification problem is posed as an optimization problem, where the decision variables of the optimization problem are the parameters of the power system to be estimated. An optimization problem objective function can include power system model outputs and their distance (e.g., 2-norm) to the observed response (from PMU measurements).

The parameter values applied in power system model 146 can be updated, step 240. The updated parameter values can be stored in model parameter record 145. By applying these conditioned parameter values, the power system model can provide more accurate response predictions of a power system reaction to disturbance events. After the model parameters are applied, parameter conditioning is complete (step 222) for the particular set of monitored PMU data. A report of estimated parameter value(s), confidence metrics, and model error response vs. measured data can be generated/displayed. In accordance with embodiments, the parameter condition tool can automatically analyze parameter sensitivities and dependencies to identify a selection of one or more parameter to be updated.

Figure 3:
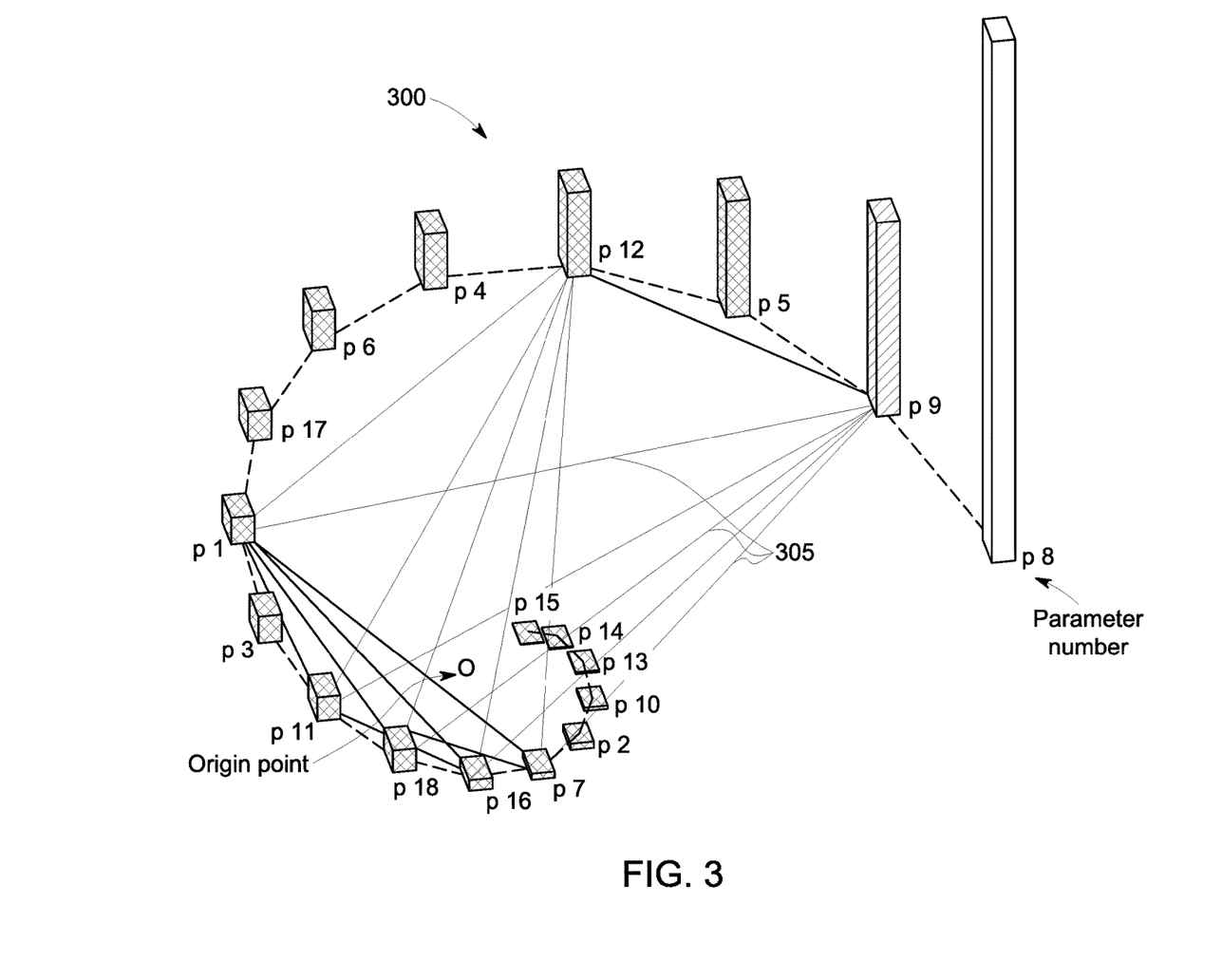
FIG. 3 depicts a spiral graph illustrating the parameter sensitivity of a power system model's prediction in accordance with embodiments.

FIG. 3 depicts spiral graph 300 illustrating the parameter sensitivity of a power system model's prediction in accordance with embodiments. Spiral graph 300 is a visualization of both the magnitude and dependency predictions of power system model 146 sensitivity to parameters. In accordance with embodiments, the values on the vertices of a spiral can be arranged in such a way that the magnitude of sensitivity decreases in a counter-clockwise direction from the origin point (0) of the graphical spiral. The spiral graph also provides interconnections 305 between any parameters having an interdependency in the model's sensitivity to the interconnected parameters.

The spiral graph is a useful visual tool in selecting those parameters most identifiable as having an impact on the model's prediction. For example, visual analysis of the spiral graph in FIG. 3 shows that parameters P8, P5 are the most identifiable parameters because they have high sensitivity magnitudes and low sensitivity dependency. Although parameter P9 indicates that the power model has a greater magnitude sensitivity to parameter P9 than parameter P5, parameter P9 has a much greater sensitivity dependence—indicated by the six interconnections between parameter P9 and parameters P12, P1, P11, P18, P16, P7, where no sensitivity dependency is indicated for parameter P5. Similarly, although parameters P17, P6, P4 have no sensitivity dependency, the model's magnitude sensitivity to these parameters is lower than its magnitude sensitivity to parameters P5, P9.

Figure 4:
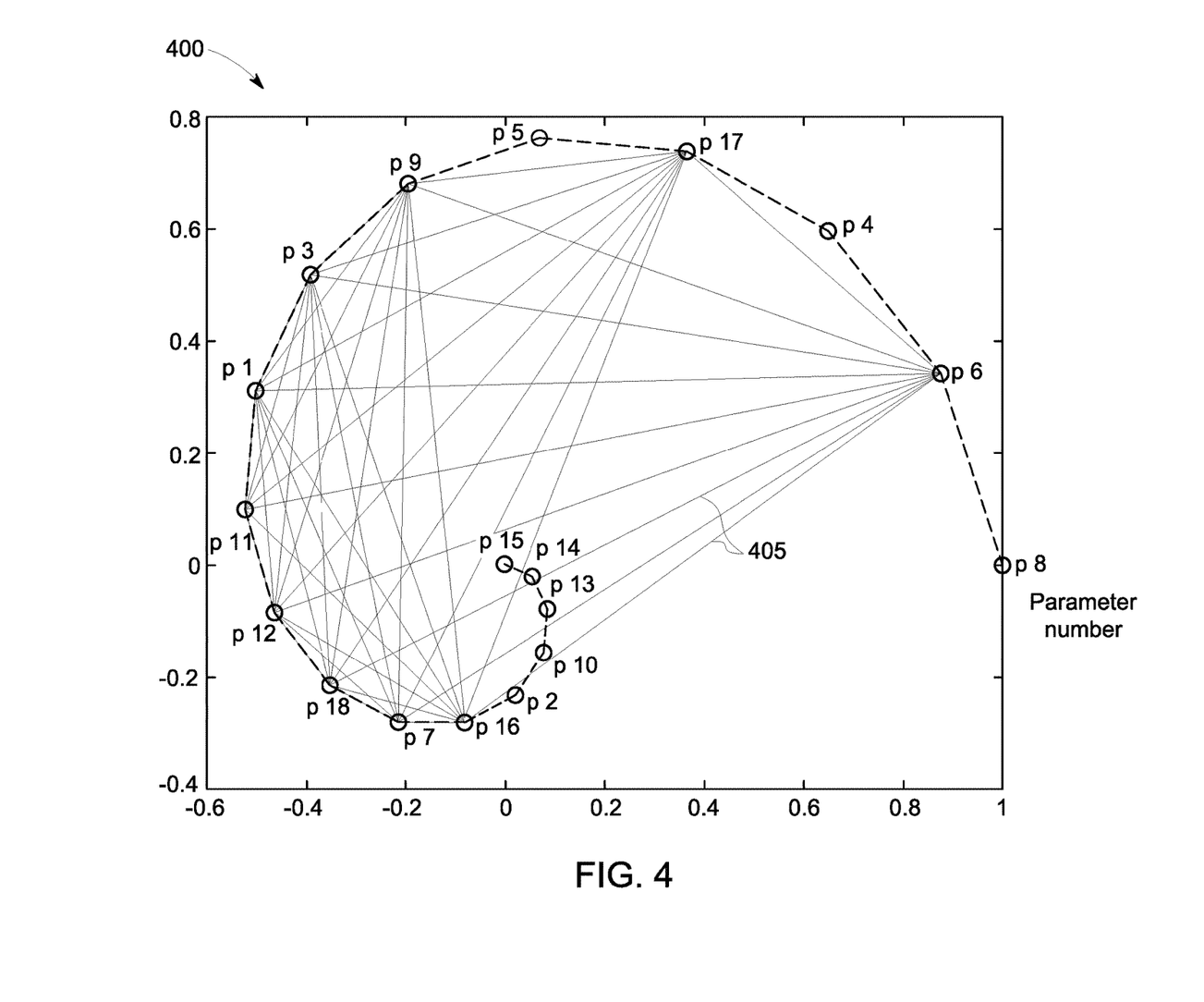
FIG. 4 depicts a spiral graph illustrating the parameter sensitivity of a power system model's active power prediction in accordance with embodiments.
Figure 5:
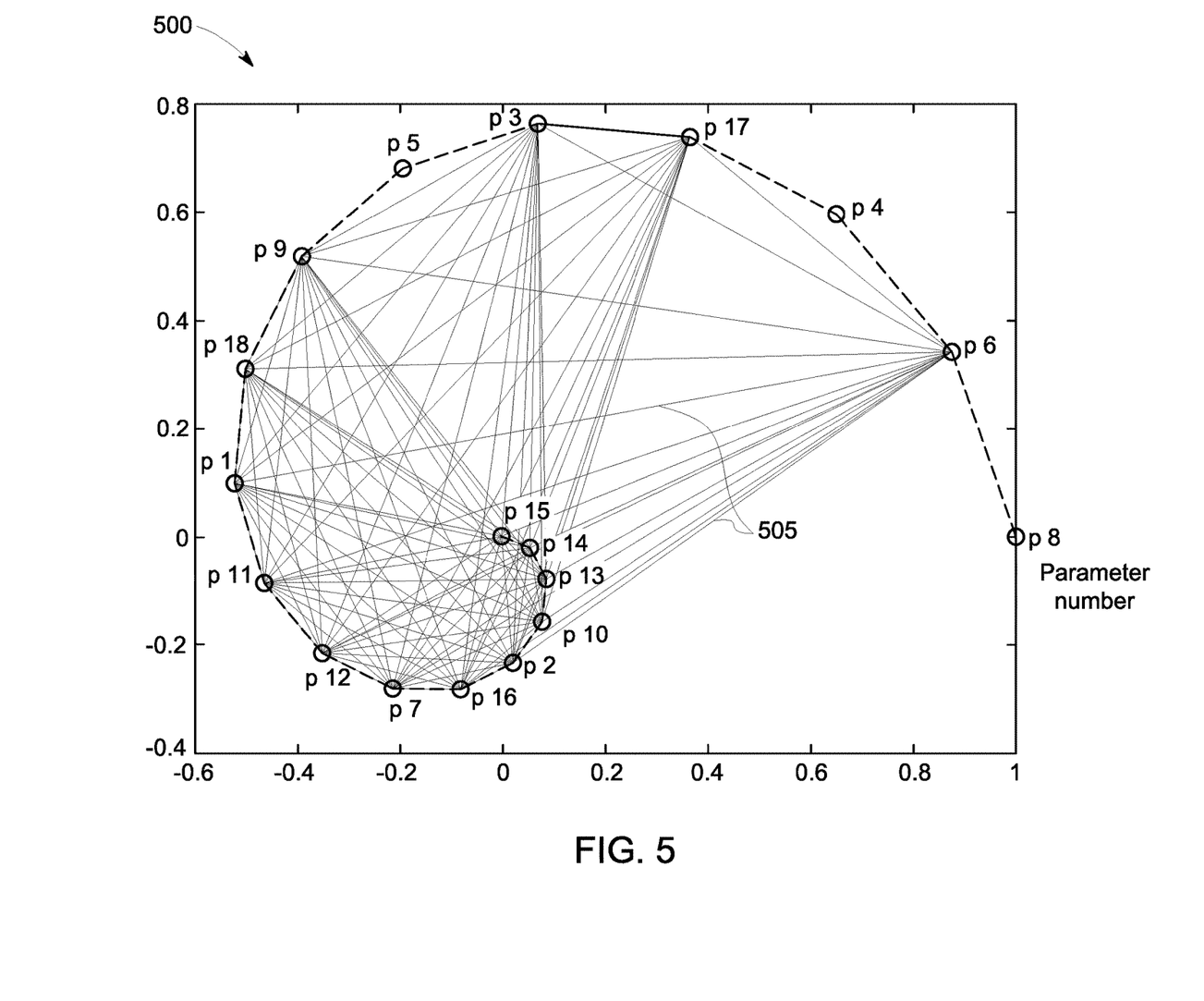
FIG. 5 depicts a spiral graph illustrating the parameter sensitivity of a power system model's reactive power prediction in accordance with embodiments.

FIG. 4 depicts spiral graph 400 illustrating the parameter sensitivity of a power system model's active power prediction in accordance with embodiments. FIG. 5 depicts spiral graph 500 illustrating the parameter sensitivity of a power system model's reactive power prediction in accordance with embodiments. Each spiral graph 400, 500 is a visualization of both power system model 146 parameter magnitude sensitivity (shown by a parameter's distance from origin (0,0) on the spiral graph) and parameter dependency sensitivity (shown by the number of interconnections 405, 505 between parameters).

Embodying systems and methods utilize actual disturbance data monitored by PMUs coupled to the electrical distribution grid. Therefore, power generation systems need not be taken off-line to evaluate the power system model. Accordingly, embodiments provide a non-invasive solution without any interruption of grid operations. Additionally, since embodiments leverage disturbance data across multiple events, there is a high probability of success in ensuring a good match between power system model prediction output and measurements across a range of events.

In accordance with embodiments, a set of identifiable parameters can be found, where the calculation of dependency is not limited to between the top two well-conditioned parameters, but rather a dependency among all selected model parameters can be calculated. This calculation of dependency is implemented using the null space instead of a distance between trajectory sensitivities. Embodying approaches provide a comprehensive parameter identifiability (magnitude sensitivity and dependency sensitivity) assessment across multiple events instead of only one event.

In accordance with some embodiments, a computer program application stored in non-volatile memory or computer-readable medium (e.g., register memory, processor cache, RAM, ROM, hard drive, flash memory, CD ROM, magnetic media, etc.) may include code or executable instructions that when executed may instruct and/or cause a controller or processor to perform a method of identifying the magnitude and dependency of device parameter sensitivities in a power system model by using data obtained from PMUs monitoring multiple disturbance events, as disclosed above.

The computer-readable medium may be a non-transitory computer-readable media including all forms and types of memory and all computer-readable media except for a transitory, propagating signal. In one implementation, the non-volatile memory or computer-readable medium may be external memory.

Although specific hardware and methods have been described herein, note that any number of other configurations may be provided in accordance with embodiments of the invention. Thus, while there have been shown, described, and pointed out fundamental novel features of the invention, it will be understood that various omissions, substitutions, and changes in the form and details of the illustrated embodiments, and in their operation, may be made by those skilled in the art without departing from the spirit and scope of the invention. Substitutions of elements from one embodiment to another are also fully intended and contemplated. The invention is defined solely with regard to the claims appended hereto, and equivalents of the recitations therein.

We claim:

1. A system comprising:
   a server including a control processor;
   the server in communication with a data store, the data store including one or more records containing phasor measurement unit monitored data representing a response of a power system to multiple disturbance events;
   a model calibration unit configured to provide event screening, simulation of a power system model response to the multiple disturbance events, and simultaneous tuning of a power system model;
   the data store including executable instructions that cause the control processor to:
   instruct the model calibration unit to perform a simulation using default model parameters in the power system model;
   perform a parameter identifiability analysis which identifies, for each of a plurality of parameters across the multiple disturbance events, a magnitude of sensitivity of a parameter to change and a sensitivity dependency of the parameter with respect to other parameter sensitivities;
   generate a spiral graph comprising a spiral visualization in which the plurality of parameters are plotted based on a magnitude of sensitivity on a first axis and dependency sensitivity on a second axis;
   select a set of parameters from the plurality of parameters based on positions of the set of parameters plotted on the spiral graph; and
   update the default model parameters based on the selected set of parameters to cause the power system model to generate a more accurate prediction of a reaction of the power system to a disturbance event.

2. The system of claim 1, the default model parameters including model parameters stored in model parameter records prior to performance of the simulation.

3. The system of claim 1, the parameter identifiability analysis including a sensitivity study to determine the power system model magnitude sensitivity and dependency sensitivity to the plurality of parameters.

4. The system of claim 3, the sensitivity study including conducting a simulation by varying values of each of the plurality of parameters and measuring a difference in the simulated performance to a performance of the power system model based on default parameter values.

5. The system of claim 1, the executable instructions configured to cause the control processor to generate at least one of estimated parameter values, confidence metrics, and graphical images of model error response versus measured data.

6. The system of claim 1, the parameter identifiability analysis applying at least one of unscented Kalman filtering and optimization-based parameter estimation.

7. A method comprising:
   receiving monitored data representing a response of a power system to multiple disturbance events;
   instructing a model calibration unit to perform a simulation using default model parameters in a power system model;
   performing a parameter identifiability analysis which identifies, for each of a plurality of parameters across the multiple disturbance events, a magnitude of sensitivity of a parameter to change and a sensitivity dependency of the parameter with respective to other parameter sensitivities;
   generating a spiral graph comprising a spiral visualization in which the plurality of parameters are plotted based on a magnitude of sensitivity on a first axis and dependency sensitivity on a second axis;
   selecting a set of parameters from the plurality of parameters based on positions of the set of parameters plotted on the spiral graph;
   updating the default model parameters based on the selected set of parameters to cause the power system model to generate a more accurate prediction of a reaction of the power system to a disturbance event.

8. The method of claim 7, the default model parameters including model parameters stored in model parameter records prior to performance of the simulation.

9. The method of claim 7, the parameter identifiability analysis including a sensitivity study to determine the power system model magnitude sensitivity and dependency sensitivity to the plurality of parameters.

10. The method of claim 9, the sensitivity study including conducting a simulation by varying values of each of the plurality of parameters and measuring a difference in the simulated performance to a performance of the power system model based on default parameter values.

11. The method of claim 7, including generating at least one of estimated parameter values, confidence metrics, and graphical images of model error response versus measured data.

12. The method of claim 7, the parameter identifiability analysis including applying at least one of unscented Kalman filtering and optimization-based parameter estimation.

13. A non-transitory computer readable medium having stored thereon instructions which when executed by a control processor cause the control processor to perform a method comprising:
   receiving monitored data representing a response of a power system to multiple disturbance events;
   instructing a model calibration unit to perform a simulation using default model parameters in a power system model;
   performing a parameter identifiability analysis which identifies, for each of a plurality of parameters across the multiple disturbance events, a magnitude of sensitivity of a parameter to change and a sensitivity dependency of the parameter with respective to other parameter sensitivities;
   generating a spiral graph comprising a spiral visualization in which the plurality of parameters are plotted based on a magnitude of sensitivity on a first axis and dependency sensitivity on a second axis;
   selecting a set of parameters from the plurality of parameters based on positions of the set of parameters plotted on the spiral graph;
   updating the default model parameters based on the selected set of parameters to cause the power system model to generate a more accurate prediction of a reaction of the power system to a disturbance event.

14. The non-transitory computer-readable medium of claim 13, wherein the method further comprises storing the default model parameters prior to performance of the simulation.

15. The non-transitory computer-readable medium of claim 13, wherein the performing comprises performing a sensitivity study to determine the power system model magnitude sensitivity and dependency sensitivity to the plurality of parameters.

16. The non-transitory computer-readable medium of claim 15, wherein the sensitivity study includes conducting a simulation by varying values of each of the plurality of parameters and measuring a difference in the simulated performance to a performance of the power system model based on default parameter values.

17. The non-transitory computer-readable medium of claim 13, wherein the method further includes generating at least one of estimated parameter values, confidence metrics, and graphical images of model error response versus measured data.

* * * * *